(12) United States Patent
Park

(10) Patent No.: US 7,399,669 B2
(45) Date of Patent: Jul. 15, 2008

(54) SEMICONDUCTOR DEVICES AND METHODS FOR FABRICATING THE SAME INCLUDING FORMING AN AMORPHOUS REGION IN AN INTERFACE BETWEEN A DEVICE ISOLATION LAYER AND A SOURCE/DRAIN DIFFUSION LAYER

(75) Inventor: Hyuk Park, Ansan (KR)

(73) Assignee: Dongbu Electronics Co., Ltd., Seoul (KR)

( * ) Notice: Subject to any disclaimer, the term of this patent is extended or adjusted under 35 U.S.C. 154(b) by 191 days.

(21) Appl. No.: 11/027,362

(22) Filed: Dec. 29, 2004

(65) Prior Publication Data

US 2005/0153529 A1     Jul. 14, 2005

(30) Foreign Application Priority Data

Dec. 30, 2003     (KR)     ...................... 10-2003-0100706

(51) Int. Cl.
*H01L 21/8238*    (2006.01)
*H01L 21/336*    (2006.01)
*H01L 21/20*     (2006.01)

(52) U.S. Cl. ...................... 438/229; 438/303; 438/307; 438/584; 257/E21.165; 257/E21.199

(58) Field of Classification Search ................ 438/229, 438/307, 584; 257/288, E21.165, E21.199
See application file for complete search history.

(56) References Cited

U.S. PATENT DOCUMENTS

| | | | | |
|---|---|---|---|---|
| 5,869,377 A | * | 2/1999 | Watabe et al. ............... | 438/305 |
| 5,899,732 A | * | 5/1999 | Gardner et al. ............. | 438/473 |
| 6,008,111 A | * | 12/1999 | Fushida et al. ............. | 438/584 |
| 6,030,863 A | * | 2/2000 | Chang et al. ................ | 438/229 |
| 6,548,331 B2 | * | 4/2003 | Lee et al. .................... | 438/149 |

* cited by examiner

*Primary Examiner*—Michael Lebentritt
*Assistant Examiner*—Ron E Pompey
(74) *Attorney, Agent, or Firm*—Andrew D. Fortney

(57) ABSTRACT

Semiconductor devices and methods for fabricating the same are disclosed in which an amorphous layer is formed in an interface between a device isolation layer and a source or drain region to stably thin a silicide layer formed in the interface. A leakage current of the silicide layer formed in the interface between the device isolation layer and the source/drain region is reduced.

18 Claims, 4 Drawing Sheets

SEMICONDUCTOR DEVICES AND METHODS FOR FABRICATING THE SAME INCLUDING FORMING AN AMORPHOUS REGION IN AN INTERFACE BETWEEN A DEVICE ISOLATION LAYER AND A SOURCE/DRAIN DIFFUSION LAYER

FIELD OF THE DISCLOSURE

The present disclosure relates generally to semiconductor fabrication, and more particularly, to semiconductor devices and methods for fabricating the same which achieve enhanced quality by decreasing a leakage current associated with a silicide layer formed in an interface between a device isolation layer and a source/drain diffusion layer.

BACKGROUND

Due to a recent trend toward high integration in semiconductor memory devices and CMOS image sensors, geometric structures in these semiconductor devices and components therein have necessarily changed.

FIG. 1 is a cross sectional view of a prior art thin film transistor. As shown in FIG. 1, a prior art semiconductor device includes an active region AR and a field region FR in a silicon semiconductor substrate 1. A device isolation layer 2 is formed in the field region FR.

The device isolation layer 2 may be formed in an LOCOS process by forming an oxidation-resistant insulating layer in the field region FR, and by selectively performing a thermal-oxidation process on the oxidation-resistant insulating layer. Alternatively, the device isolation layer 2 may be formed in a sequential process of forming an oxidation-resistant insulating layer in the active region AR, forming a trench by selectively removing the semiconductor substrate in the field region FR, forming an oxide layer to fill the trench, and selectively removing the oxide layer to expose the surface of the semiconductor substrate by a CMP process, wherein the device isolation layer 2 is formed in the trench.

Next, the semiconductor device, for example, the thin film transistor 10, is formed in the active region AR. That is, the thin film transistor 10 is formed with a gate insulating layer 11 and a gate electrode 12, by sequentially depositing and selectively removing portions of the gate insulating layer 11 and a conductive layer on the semiconductor substrate 1.

Subsequently, an insulating layer is deposited on the entire surface of the semiconductor substrate 1. This insulating layer is anisotropically etched to form sidewall-insulating layers 13 on opposite sidewalls of the gate electrode 12. Next, impurity ions are implanted into the active region AR of the semiconductor substrate 1 on opposite sides of the gate electrode 12 while using the gate electrode 12 and the sidewall-insulating layers 13 as a mask to thereby form source/drain regions 14.

Next, a metal line (not shown) is formed on the semiconductor substrate 1. A silicide layer 15 is then formed on the surfaces of the source/drain regions 14 to enhance the electric contact with the source/drain regions 14.

In the above described thin film transistor structure, the silicide layer 15 is formed in a sequential process of depositing a refractory metal on the entire surface of the semiconductor substrate 1, and then performing a thermal process thereon. As a result, the silicide layer 15 is formed on the surface of the source/drain regions 14 at an interface between the silicon semiconductor substrate 1 and the refractory metal. If the gate electrode 12 is formed of silicon, the silicide layer 15 is also formed on the surface of the gate electrode 12.

However, when the thermal process is performed on the refractory metal on the entire surface of the semiconductor substrate 1 to form the silicide layer 15 on the surface of the source/drain regions 14, a silicide layer 15a is also formed in the interfaces between the device isolation layers 2 and the source/drain regions 14. That is, ions of the refractory metal penetrate into the interfaces between the device isolation layers 2 and the source/drain regions 14. As a result, silicide layers 15a are formed in the interfaces between the device isolation layers 2 and the source/drain regions 14.

The device isolation layer 2 and the source/drain regions 14 are formed of different materials, at different thickness, and in different surface states. Therefore, it is difficult to maintain a uniform thickness of the silicide layers 15a formed in the interfaces between the device isolation layers 2 and the source/drain regions 14 without an additional process. Furthermore, the silicide layers 15a formed in the interfaces between the device isolation layers 2 and the source/drain regions 14 may cause a leakage current, thereby deteriorating the quality of the resulting semiconductor device.

BRIEF DESCRIPTION OF THE DRAWINGS

Wherever possible, the same reference numbers will be used throughout the drawings to refer to the same or like parts.

DETAILED DESCRIPTION

Figure 1:
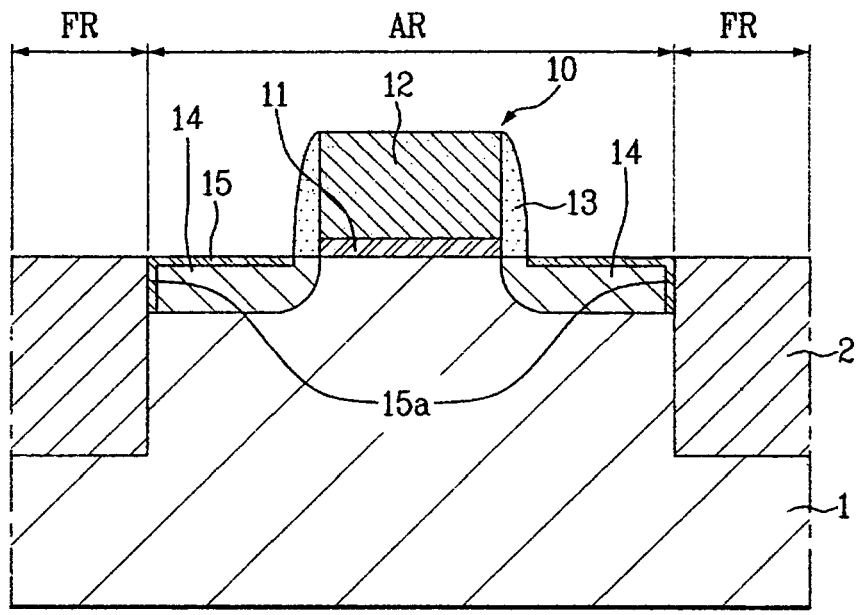
FIG. 1 is a cross sectional view of a prior art semiconductor device.
Figure 2:
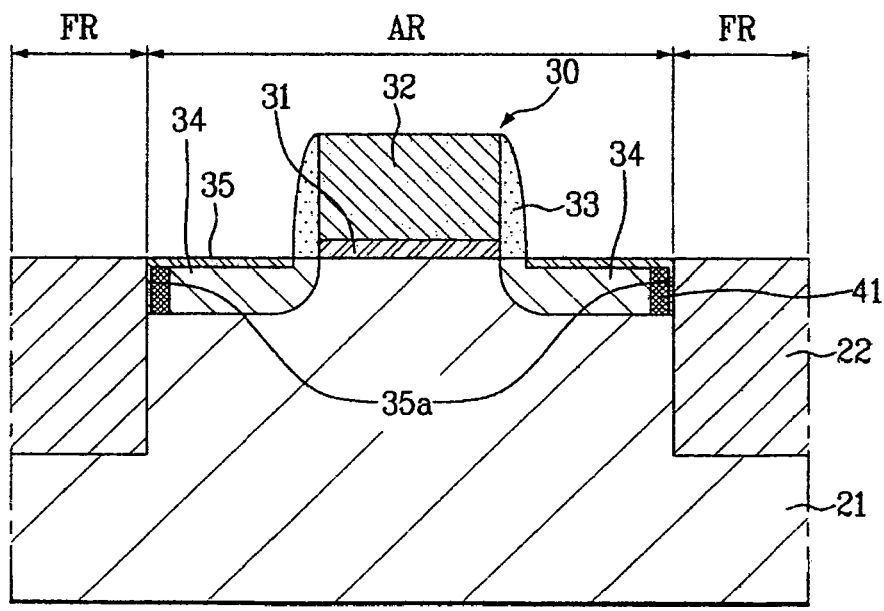
FIG. 2 is a cross sectional view illustrating an example semiconductor device constructed in accordance with the teachings of the present invention.

FIG. 2 is a cross sectional view illustrating an example semiconductor device constructed in accordance with the teachings of the present invention. In the example of FIG. 2, the semiconductor device includes a silicon semiconductor substrate 21 having an active region AR and field regions FR. Device isolation layers 22 are formed in the field regions FR.

The device isolation layers 22 may be formed in a LOCOS process by forming oxidation-resistant insulating layers in the field regions FR, and by selectively performing a thermal-oxidation process on the oxidation-resistant insulating layers. Alternatively, the device isolation layers 22 may be formed by sequentially forming oxidation-resistant insulating layers in the active regions AR, forming trenches by selectively removing the semiconductor substrate 21 in the field regions FR, forming an oxide layer to fill the trenches, and selectively removing the oxide layer by a CMP process to expose the surface of the semiconductor substrate 21, wherein the device isolation layers 22 are formed in the trenches.

Next, a transistor 30 is formed in the active region AR of the semiconductor substrate 21 to selectively switch the flow of electric charges. The transistor 30 includes a gate insulating layer 31 on the semiconductor substrate 21, a gate electrode 32 on the gate insulating layer 31, sidewall-insulating layers 33 on opposite sidewalls of the gate electrode 32, and source/drain regions 34 in the active region of the semiconductor substrate 21 on opposite sides of the gate electrode 32.

The source/drain regions 34 have amorphous structures 41 in the portions adjacent to the device isolation layers 22. Also, silicide layers 35 are formed on the surfaces of the source/drain regions 34 to improve the electric contact with metal lines (not shown). Furthermore, silicide layers 35a are thinly and uniformly formed in the interfaces between the device isolation layers 22 and the source/drain regions 34.

As compared with the case of forming the silicide layers in a crystalline silicon substrate, the silicide layers formed in an amorphous silicon substrate are formed more thinly and uniformly. Further, the mobility of electric charges in the crystalline silicon layer is greater than the mobility of electric charges in the amorphous silicon substrate. Accordingly, the source/drain regions 34 adjacent to the device isolation layers 22 are formed as amorphous layers 41, so that the silicide layers 35a at the interfaces between the device isolation layers 22 and the source/drain regions 34 are thinner and more uniform than in the prior art.

It is preferable to form the amorphous layers 41 in the interfaces between the device isolation layers 22 and the source/drain regions 34 at a thickness between about 1 μm and 5 μm.

The silicide layers 35a, formed in the interfaces between the device isolation layers 22 and the source/drain regions 34, are thin and uniform. Consequently, it is possible to decrease the leakage current of the silicide layers 35a. Also, the entire semiconductor device has a constant leakage current, thereby enhancing the quality of the semiconductor device.

An example method for fabricating a semiconductor device performed in accordance with the teachings of the present invention will now be described. FIG. 3a to FIG. 3F are cross sectional views illustrating the example fabrication process.

Figure 3A:
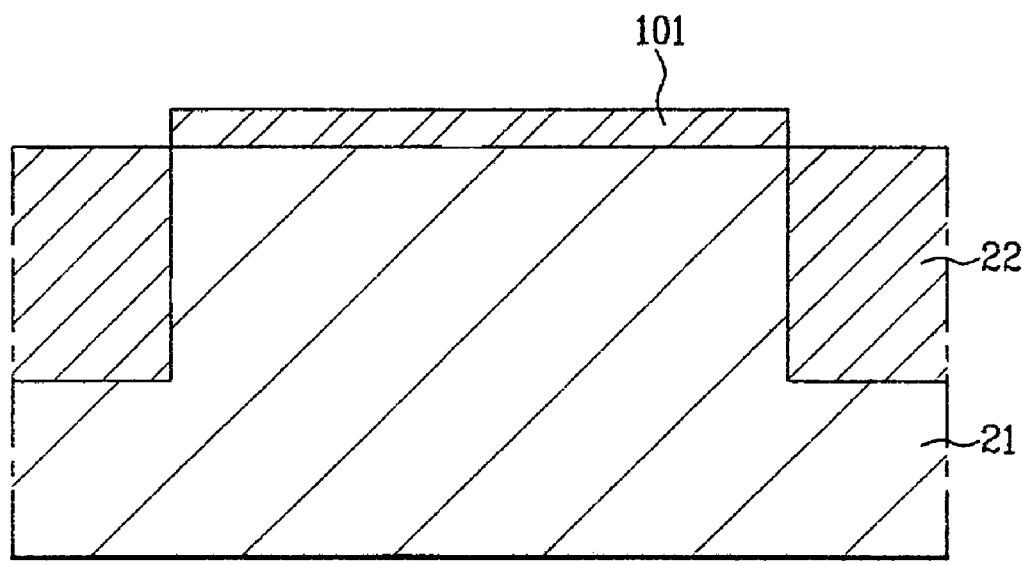
FIG. 3A to FIG. 3F are cross sectional views illustrating an example fabrication process performed in accordance with the teachings of the present invention.

As shown in FIG. 3A, an oxidation-resistant insulating layer 101 is formed on an entire surface of a semiconductor substrate 21. The semiconductor substrate 21 includes an active region AR and field regions FR. Next, the oxidation-resistant insulating layer 101 of the field region FR is selectively removed by photolithography. The oxidation-resistant insulating layer 101 may be formed of a nitride layer, or a deposition layer including an oxide layer and a nitride layer.

Trenches are formed in the field regions FR by selectively etching the field regions FR of the semiconductor substrate 21. After that, the device isolation layer 22 is formed in the trench by sequentially performing an insulating layer gap filling process and a CMP process. These processes are collectively referred to as an STI (shallow trench isolation) process. Instead of the STI process, the device isolation layer 22 may be formed in an LOCOS (local oxidation of silicon) process. Then, the oxidation-resistant insulating layer 101 is removed.

Figure 3B:
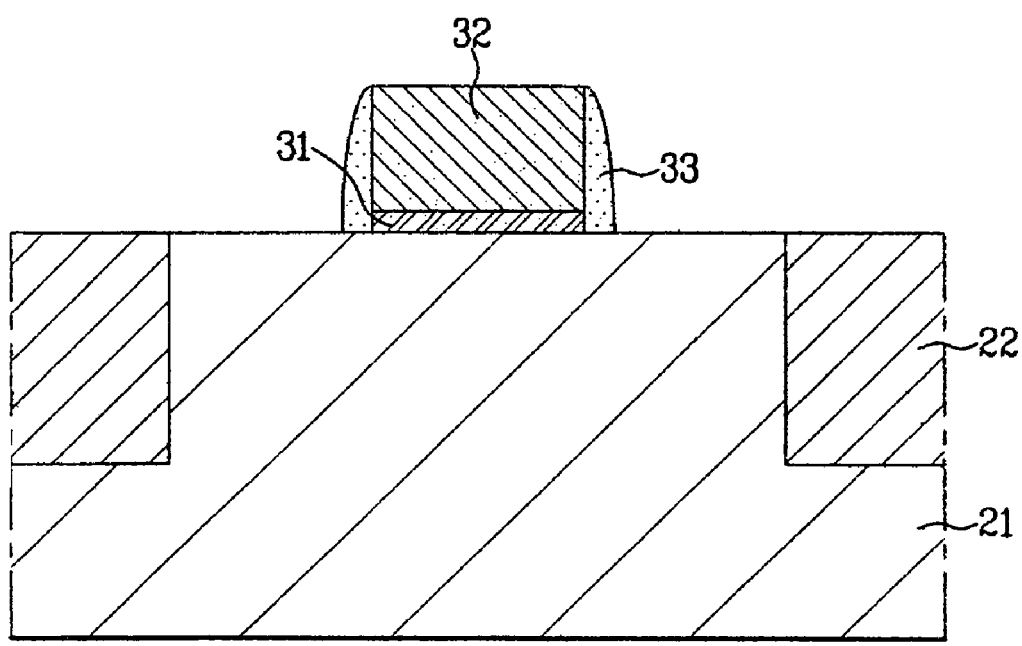

Referring to FIG. 3B, a gate insulating layer 31 and a conductive layer are sequentially deposited on the semiconductor substrate 22. Portions of the gate insulating layer 31 and the conductive layer are then selectively removed by photolithography to thereby form the gate insulating layer 31 and the gate electrode 32 in the active region AR.

Subsequently, an oxide layer or a nitride layer is deposited on the entire surface of the semiconductor substrate 21 including on the gate electrode 32. Then, the oxide layer or the nitride layer is etched by a dry-etch process having anisotropic etching characteristics or by a reactive ion etching process to thereby form sidewall insulating layers 33 on the sidewalls of the gate electrode 32.

Figure 3C:
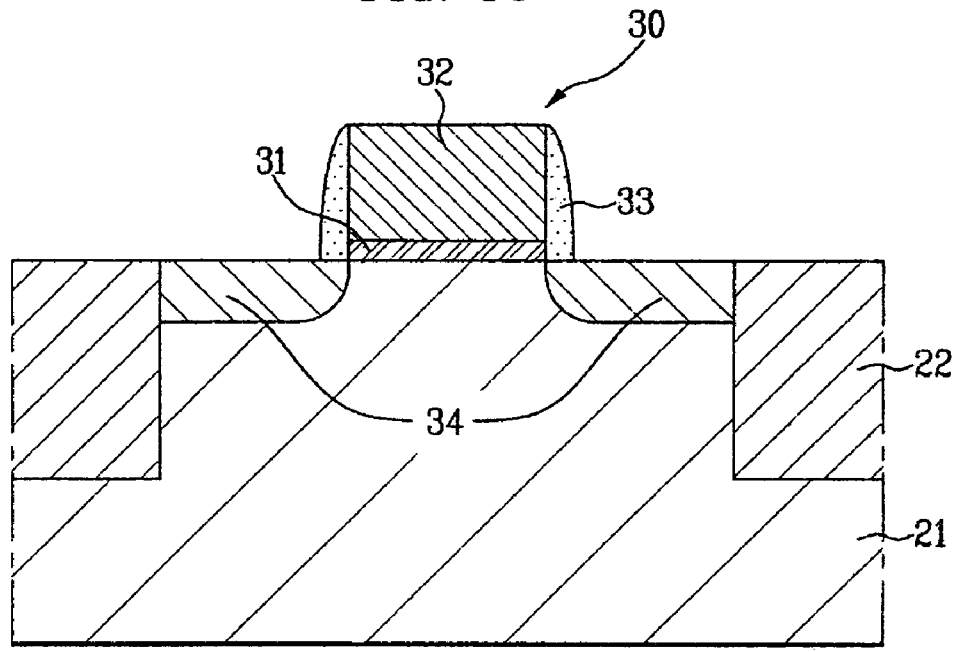

As shown in FIG. 3C, highly doped impurity ions are implanted into the semiconductor substrate 21 of the active region AR while using the sidewall insulating layers 33 and the gate electrode 32 as a mask. As a result, the source/drain regions 34 are formed on opposite sides of the gate electrode 32 in the active region AR of the semiconductor substrate 21.

Although not shown, before forming the sidewall insulating layers 33 and after forming the gate insulating layer 31 and the gate electrode 32, lightly doped impurity ions may be implanted into the active region AR of the semiconductor substrate 21 on opposite sides of the gate electrode 32 while using the gate electrode 32 as a mask to thereby form the sidewall insulating layers 33. Then, highly doped impurity ions may be implanted into the active region AR of the semiconductor substrate 21 while using the gate electrode 32 and the sidewall insulating layers 33 as a mask to thereby form the source/drain regions 34.

Figure 3D:
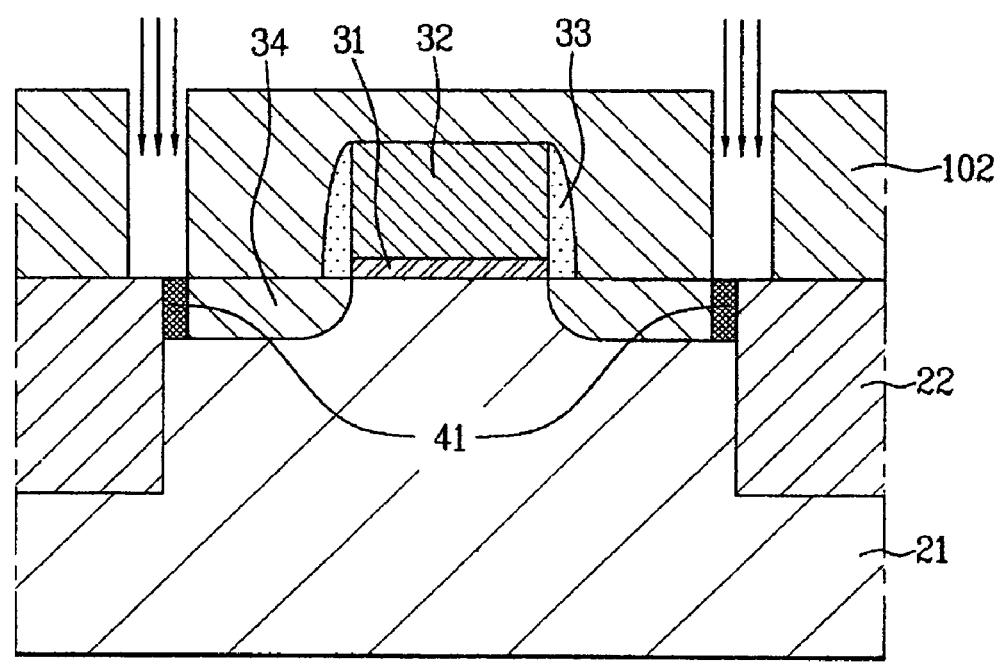

As shown in FIG. 3D, a photoresist layer 102 is deposited on the entire surface of the semiconductor substrate 21. The photoresist layer is patterned to expose the source/drain regions 34 adjacent to the device isolation layers 22 by an exposure and development process using a mask. Then, by implanting ions into the source/drain regions 34 adjacent to the device isolation layers 22 exposed by the photoresist pattern 102, the amorphous layer 41 is formed in the source/drain regions 34 adjacent to the device isolation layers 22. In the illustrated example, the amorphous layers 41 have a predetermined thickness between about 1 μm and about 5 μm In the illustrated example, Ge+ ions are used.

Figure 3E:
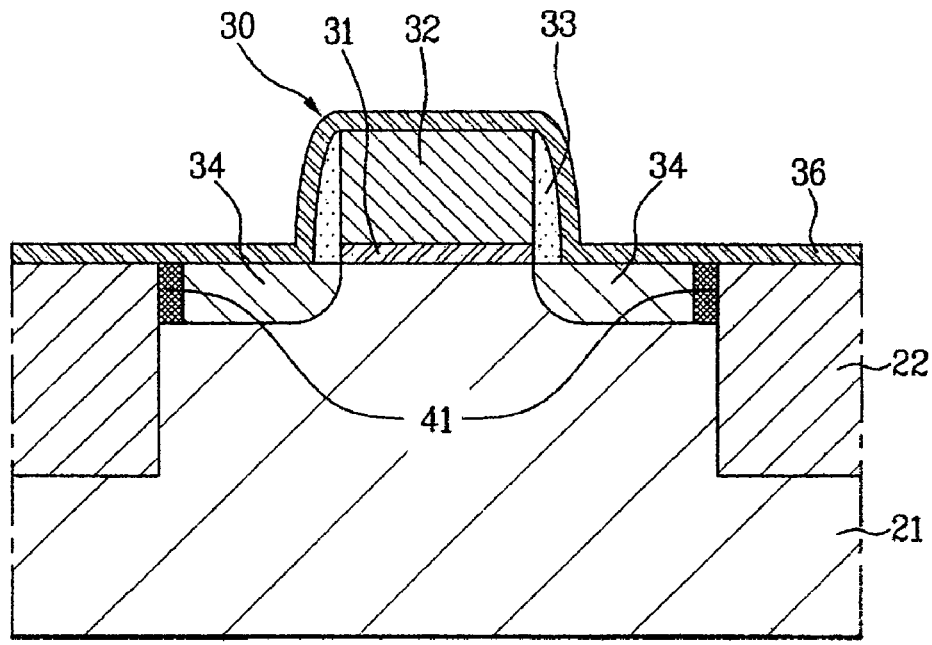
Figure 3F:
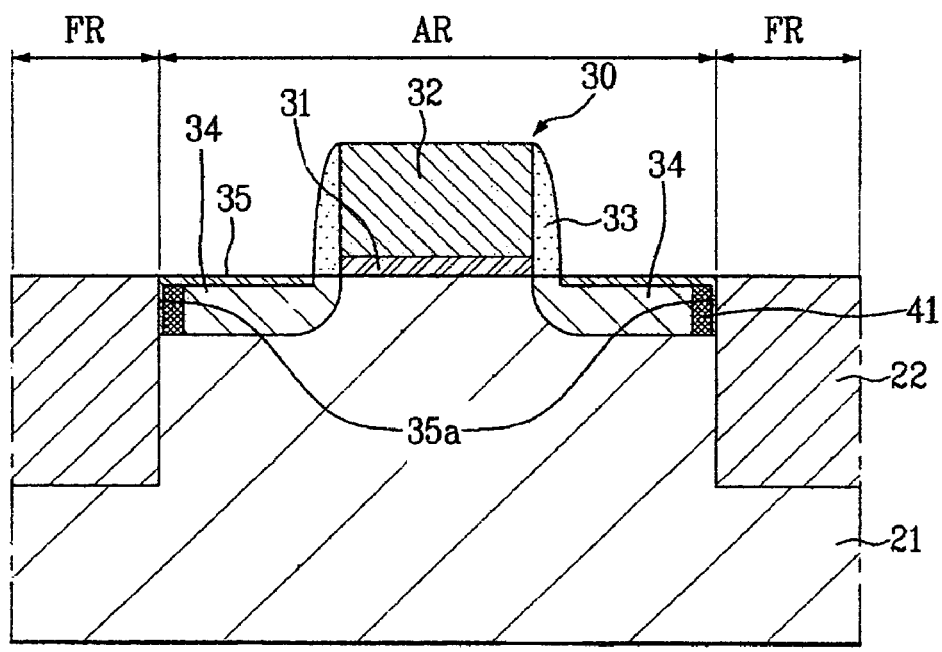

As shown in FIG. 3E, after removing the photoresist pattern 102, a refractory metal 36 of tungsten or titanium is deposited on the entire surface of the semiconductor substrate 21 by sputtering. A thermal process is then performed on the resulting structure.

Then, a silicide layer 35 of $Si_XW_Y$ or $SiTi_X$ is formed on the surface of the source/drain regions 34 in the interface between the silicon semiconductor substrate 21 and the refractory metal 36. If the gate electrode 32 is formed of silicon, the silicide layer is also formed on the surface of the gate electrode 32.

When the thermal process is performed on the refractory metal formed on the entire surface of the semiconductor substrate to form the silicide layer 35 on the surface of the source/drain regions 34, the silicide layers 35a are also formed in the interfaces between the device isolation layers 22 and the source/drain regions 34.

However, the source/drain regions 34 adjacent to the device isolation layers 22 are formed as amorphous layers 41. Consequently, the silicide layers 35a are thinly formed in the interfaces between the device isolation layers 22 and the source/drain regions 34 due to the amorphous layer 41. Since the leakage current of the silicide layers 35a is in proportion to the thickness of the silicide layers 35a, it is possible to decrease the leakage current of the silicide layers 35a by decreasing the thickness of the silicide layers 35a.

After removing the refractory metal 36, the conventional processes of forming an insulating interlayer (not shown), forming a contact hole (not shown), and forming the metal line (not shown) are sequentially performed, to thereby complete the semiconductor device.

From the foregoing, persons of ordinary skill in the art will appreciate that the illustrated semiconductor device includes amorphous layers formed in the source/drain regions 14 adjacent the device isolation layers 22. The presence of these amorphous layers 41 stably thins the silicide layers 35a. As a result, it is possible to decrease the leakage current of the silicide layers 35a formed in the interfaces between the device isolation layers 22 and the source/drain regions 14, thereby enhancing the quality of the completed semiconductor device.

From the foregoing, persons of ordinary skill in the art will readily appreciate that semiconductor devices and methods for fabricating the same have been disclosed which decrease a leakage current of a silicide layer formed in an interface between a device isolation layer and a source or drain region.

In the illustrated example, this decrease in leakage current is accomplished by forming an amorphous layer in the interface between the device isolation layer and the source or drain region to stably thin the silicide layer formed in the interface between the device isolation layer and the source/drain region.

An illustrated example semiconductor device includes a semiconductor substrate having an active region and a field region; a device isolation layer in the field region; a gate electrode on the active region; source/drain regions in the active region on opposite sides of the gate electrode; and an amorphous layer in the source or drain region adjacent the device isolation layer.

In the illustrated example, the amorphous layer is formed at a thickness between about 1 μm and 5 μm.

In addition, the illustrated semiconductor device includes a silicide layer on the surface of the source/drain regions.

An illustrated example method for fabricating a semiconductor device includes forming a device isolation layer in a field region of a semiconductor substrate to define an active region; forming a gate electrode on the active region; forming source/drain regions in the active region on opposite sides of the gate electrode; implanting ions to form an amorphous layer in the source or drain region adjacent to the device isolation layer; and forming a silicide layer on the surface of the source/drain regions.

In the illustrated example, the implanted ions are Ge+ ions.

Also, in the illustrated example, forming the silicide layer on the surface of the source/drain regions comprises depositing a refractory metal on an entire surface of the semiconductor substrate, and performing a thermal process to form a silicide layer in an interface between the refractory metal and the source or drain region.

It is noted that this patent claims priority from Korean Patent Application Serial Number P2003-100706, which was filed on Dec. 30, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor device comprising:
    forming a device isolation layer in a field region of a semiconductor substrate to define an active region;
    forming a gate electrode on the active region;
    forming source/drain regions on opposite sides of the gate electrode;
    forming a photoresist pattern on the semiconductor substrate that exposes a part of each source/drain region adjacent to the device isolation layer and masks a remaining part of each source/drain region;
    implanting ions using the photoresist pattern as a mask to form an amorphous layer in the exposed part of each source/drain region adjacent to the device isolation layer; and
    forming a silicide layer on the surface of the source/drain regions including the amorphous layer.

2. A method as defined in claim 1, wherein the ions comprise Ge+ ions.

3. A method as defined in claim 1, wherein forming the silicide layer on the surface of the source/drain regions comprises:
    depositing a refractory metal on the semiconductor substrate; and
    performing a thermal process to form the silicide layer at an interface between the refractory metal and the at least one of the source region or the drain region.

4. A method as defined in claim 1, further comprising forming an insulating layer on the gate and the source/drain regions.

5. A method as defined in claim 4, further comprising forming a contact hole in the insulating layer.

6. A method as defined in claim 5, further comprising forming a metal line on the insulating layer.

7. A method as defined in claim 1, wherein forming the device isolation layer comprises:
    forming an oxidation-resistant insulating layer; and
    selectively removing parts of the oxidation-resistant insulating layer; and
    performing a local oxidation process on the exposed silicon.

8. A method as defined in claim 7, wherein the oxidation-resistant insulating layer comprises a nitride layer.

9. A method as defined in claim 7, wherein the oxidation-resistant insulating layer comprises an oxide layer and a nitride layer.

10. A method as defined in claim 1, wherein forming the device isolation layer comprises:
    forming an oxidation-resistant insulating layer in the active regions;
    forming a trench by selectively removing the semiconductor substrate in a field region;
    forming an oxide layer to fill the trenches; and
    selectively removing the oxide layer by a CMP process to expose the surface of the semiconductor substrate.

11. A method as defined in claim 10, wherein the oxidation-resistant insulating layer comprises a nitride layer.

12. A method as defined in claim 10, wherein the oxidation-resistant insulating layer comprises an oxide layer and a nitride layer thereon.

13. A method as defined in claim 1, wherein the amorphous layer has a thickness of from 1 μm to 5 μm.

14. A method as defined in claim 1, wherein forming the device isolation layer comprises a LOCOS process or a shallow trench isolation (STI) process.

15. A method as defined in claim 1, wherein the silicide layer comprises $Si_xW_y$ or $SiTi_x$.

16. A method as defined in claim 1, wherein the gate electrode comprises silicon.

17. A method as defined in claim 16, wherein the silicide layer is also formed on the surface of the gate electrode.

18. A method as defined in claim 1, wherein forming the photoresist pattern on the semiconductor substrate also masks the device isolation layer.

* * * * *